United States Patent [19]
Kang et al.

[11] Patent Number: 5,787,035
[45] Date of Patent: Jul. 28, 1998

[54] MEMORY CELL ARRAY

[75] Inventors: Ho Cheol Kang, Kyungki-Do; Jong Ho Kim, Seoul, both of Rep. of Korea

[73] Assignee: Hyundai Electronics Industries Co., Ltd., Kyungki-do, Rep. of Korea

[21] Appl. No.: 924,005

[22] Filed: Aug. 29, 1997

[30] Foreign Application Priority Data

Aug. 30, 1996 [KR] Rep. of Korea .................. 96-36631

[51] Int. Cl.⁶ .................................................. G11C 13/00
[52] U.S. Cl. .............................. 365/185.05; 365/185.01
[58] Field of Search ........................ 365/185.05, 185.1, 365/185.26

[56] References Cited

U.S. PATENT DOCUMENTS 4,274,012  6/1981  Simko ........................... 365/185.01
5,504,708  4/1996  Santin et al. .

*Primary Examiner*—Terrell W. Fears
*Attorney, Agent, or Firm*—Scott C. Harris, Esq.

[57] ABSTRACT

The present invention relates to memory cell array, each floating gate of each memory cell is placed between each drain region and each source region so that four memory cells hold single source region or single drain region in common.

2 Claims, 4 Drawing Sheets

MEMORY CELL ARRAY

BACKGROUND OF THE INVENTION

1. Field of the Invention

The present invention relates to a memory cell array, and particularly to a memory cell array in which four memory cells hold a drain region or a source region in common.

2. Description of the Prior Art

Generally, a flash memory device having electrically programming and erasing functions consists of a peripheral circuit and a memory cell array, and the memory cell array consists of a plurality of memory cells selected respectively by a word line and a bit line.

The programming operation to store data in the memory cell is performed by injection of hot electron into a floating gate, and the erasing operation to erase the stored data is performed by discharge of electron injected into the floating gate.

The memory cell is divided into a stack gate type and a split gate type according to the type of gate electrode. Conventional memory cell array which consists of memory cells of stack gate type is described through FIG. 1.

FIG. 1 is a layout for illustrating a conventional memory cell array. A plurality of field oxide layers 1 are formed at isolation regions of a silicon substrate, and a plurality of floating gates 2 electrically isolated from the silicon substrate by a tunnel oxide layer are formed at channel regions of the silicon substrate. Both ends of each floating gate 2 overlap with the field oxide layers 1. Control gates 3 electrically isolated from the floating gates 2 by a dielectric layer are formed on the floating gates 2 which intersect the field oxide layers 1.

Drain regions 6 are formed on the silicon substrate corresponded to insides of the control gates 3 intersecting the field oxide layers 1, respectively, and source regions 5 are formed on the silicon substrate corresponded to outsides of the control gates 3. Contact portions 4 for connecting to bit lines 7 which intersect the control gates 3, respectively, are formed at the drain regions 6.

In the memory cell array described above, two bits, that is, two memory cells hold the single drain region 6 in common. And, the each drain region 6 is connected to the bit line 7 through a contact hole formed at contact portion of the drain region 6 connected in common. However, since the size of device is determined by the size of contact hole and the occupied area of contact hole, in case that such layout as mentioned above is used, it is difficult to increase integration density of device and to keep a proper distance between the control gate 3 and the contact portion 4, and between the contact portion 4 and the field oxide layer 1.

SUMMARY OF THE INVENTION

Therefore, the object of the present invention is to provide a memory cell array in which four memory cells hold a source region or a drain region in common to overcome such disadvantages as described above.

In order to achieve the object mentioned above, the memory cell array of the present invention comprises a plurality of field oxide layers formed at isolation regions and arranged in the form of a plurality of rows, the each field oxide layer of a row is corresponded the space between the field oxide layers of adjacent rows. The memory cell array of the present invention also comprises a plurality of floating gates formed on a silicon substrate between the field oxide layer of a row and the field oxide layer of adjacent row. A plurality of control gates are formed on the floating gates formed between the field oxide layers and the field oxide layers placed in both sides of the floating gates.

A plurality of source regions are formed on the silicon substrate surrounded by adjacent four field oxide layers and adjacent four floating gates, the source regions are separated from each other by the field oxide layer. A plurality of drain regions are formed on the silicon substrate surrounded by adjacent four field oxide layers and adjacent four floating gates, the drain regions are separated from each other by the field oxide layer. In the present invention, the each floating gate is placed between each drain region and each source region so that four memory cells hold the single source region or single drain region in common.

BRIEF DESCRIPTION OF THE DRAWINGS

Other objects and advantages of the present invention will be understood by reading the detailed explanation of the embodiment with reference to the accompanying drawings in which.

Below, the present invention will be described in detail with reference to the accompanying drawings.

DETAILED DESCRIPTION OF THE INVENTION

Figure 1:
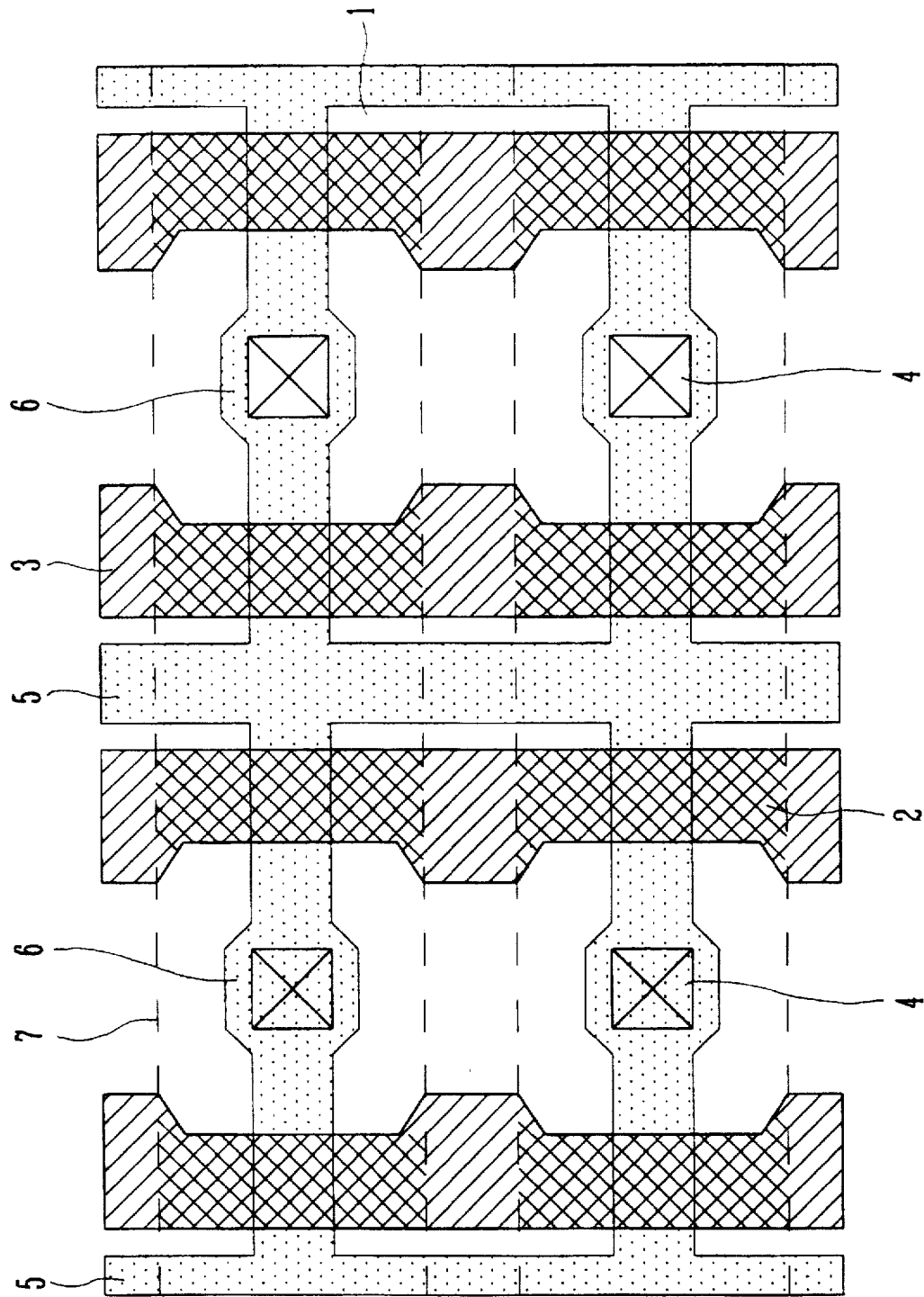
FIG. 1 is a layout illustrating a memory cell array of a prior art.
Figure 2:
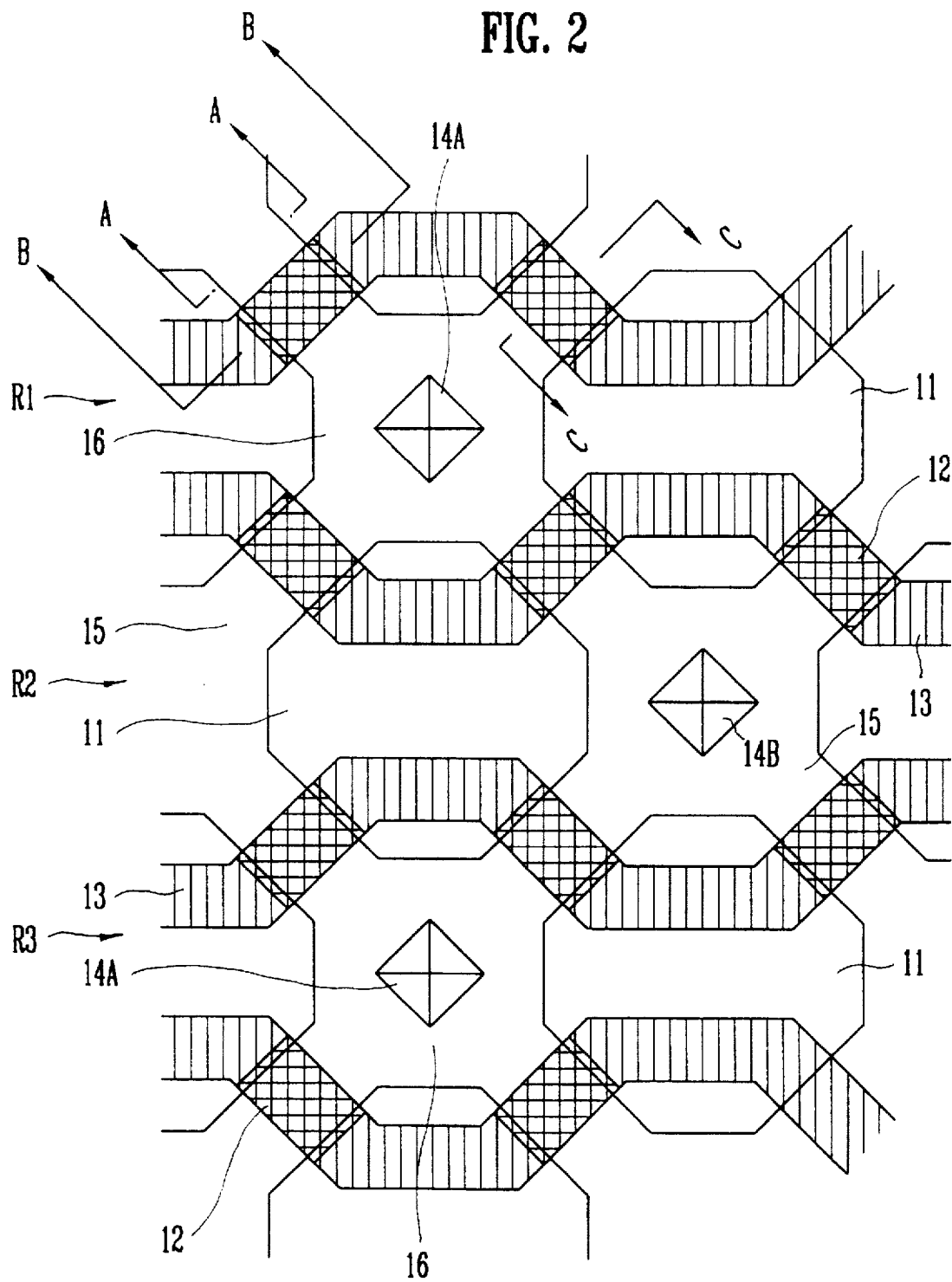
FIG. 2 is a layout illustrating a memory cell array in accordance with the present invention.

FIG. 2 is a layout for illustrating a memory cell array in accordance with the present invention, construction of memory cell array is as follows.

A plurality of field oxide layers 11 composed in polygonal shape, for example, hexagonal form, are formed at isolation regions of a silicon substrate, the field oxide layers 11 are arranged in form of a plurality of rows R1, R2 and R3. The each field oxide layer 11 of each row (for example, R2) corresponds to the space between the field oxide layers 11 of adjacent rows (R1 and R3).

Each floating gate 12 whose both ends are overlapped with sides of the each field oxide layer 11, is formed between the field oxide layer 11 and the field oxide layer 11 of an adjacent row, and control gates 13 are formed on the floating gates 12 and the field oxide layers 11, respectively. Width of the each control gate 13 is same as the width of the each floating gate 12, and the floating gates 12 and the control gates 13 are isolated electrically from each other by dielectric layer.

As shown in FIG. 2, the control gates 13 are formed on the floating gates 12 formed between the field oxide layers 11 and the field oxide layers 11 located at both sides of the floating gates 12, therefore two control gates 12 separated from each other are formed on the each field oxide layer 11.

On the other hand, source regions 15 having a source contact 14B or drain regions 16 having a drain contact 14A are formed on the silicon substrate surrounded by adjacent four field oxide layers 11 and adjacent four floating gates 12, and contact holes are formed at the each drain contact 14A and each source contact 14B, respectively. Here, as shown in FIG. 2, each source region 15 and each drain region 16 are surrounded by four field oxide layers 11 and four floating gates 12, respectively. Also each floating gate 12 is located between the source region 15 and drain region 16, and the each field oxide layer 11 is placed between the drain region 16 and another drain region 16 and between the source region 15 and another source region 15. Thus, as shown in FIG. 2, four memory cells hold the single source region 15 or the single drain region 16 in common.

Each part of the memory cell array illustrated in FIG. 2 will be described in order to help understanding of the present invention with reference to FIG. 3A to FIG. 3C.

Figure 3A:
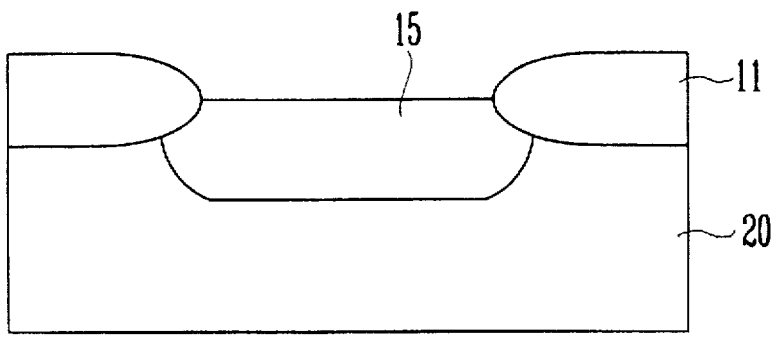
FIG. 3A is a cross sectional view taken along line A—A of FIG. 2.
Figure 3B:
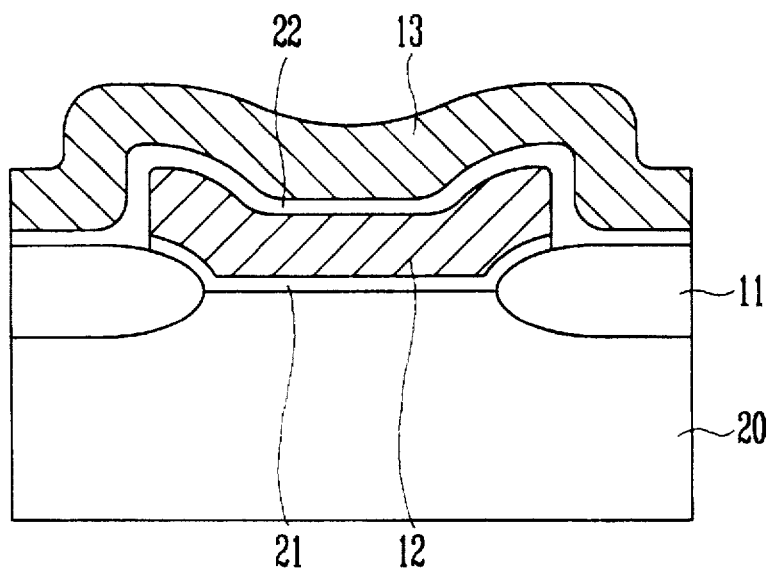
FIG. 3B is a cross sectional view taken along line B—B of FIG. 2.

FIG. 3A is a cross sectional view taken along line A—A in FIG. 2, the source region 15 is formed on silicon substrate 20 between adjacent field oxide layers 11. FIG. 3B is a cross sectional view taken along line B—B in FIG. 2, the gate electrode having a stack structure of the tunnel oxide layer 21, the floating gate 12, the dielectric layer 22 and the control gate 13, is formed on the silicon substrate between adjacent field oxide layers 11.

Figure 3C:
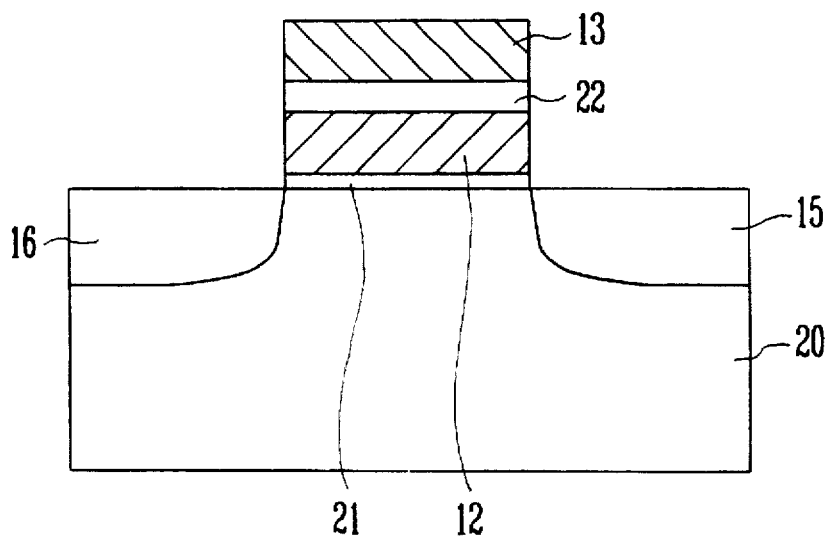
FIG. 3C is a cross sectional view taken along line C—C of FIG. 2.

FIG. 3C is a cross sectional view taken along line C—C in FIG. 2, the gate electrode having a stack structure of the tunnel oxide layer 21, the floating gate 12, the dielectric layer 22 and the control gate 13, is formed on the silicon substrate between the source region 15 and the drain region 16.

In the memory cell array as described above, four bits, that is, four memory cells hold the single source region 15 or the single drain region 16 in common, therefore, the area occupied by contact hole is decreased, thereby decreasing a size of device. On the other hand, since the size of each field oxide layer 11 and each floating gate 12 can be increased in comparison with the prior art, an electric insulation between devices and operation characteristics will be enhanced.

Figure 4:
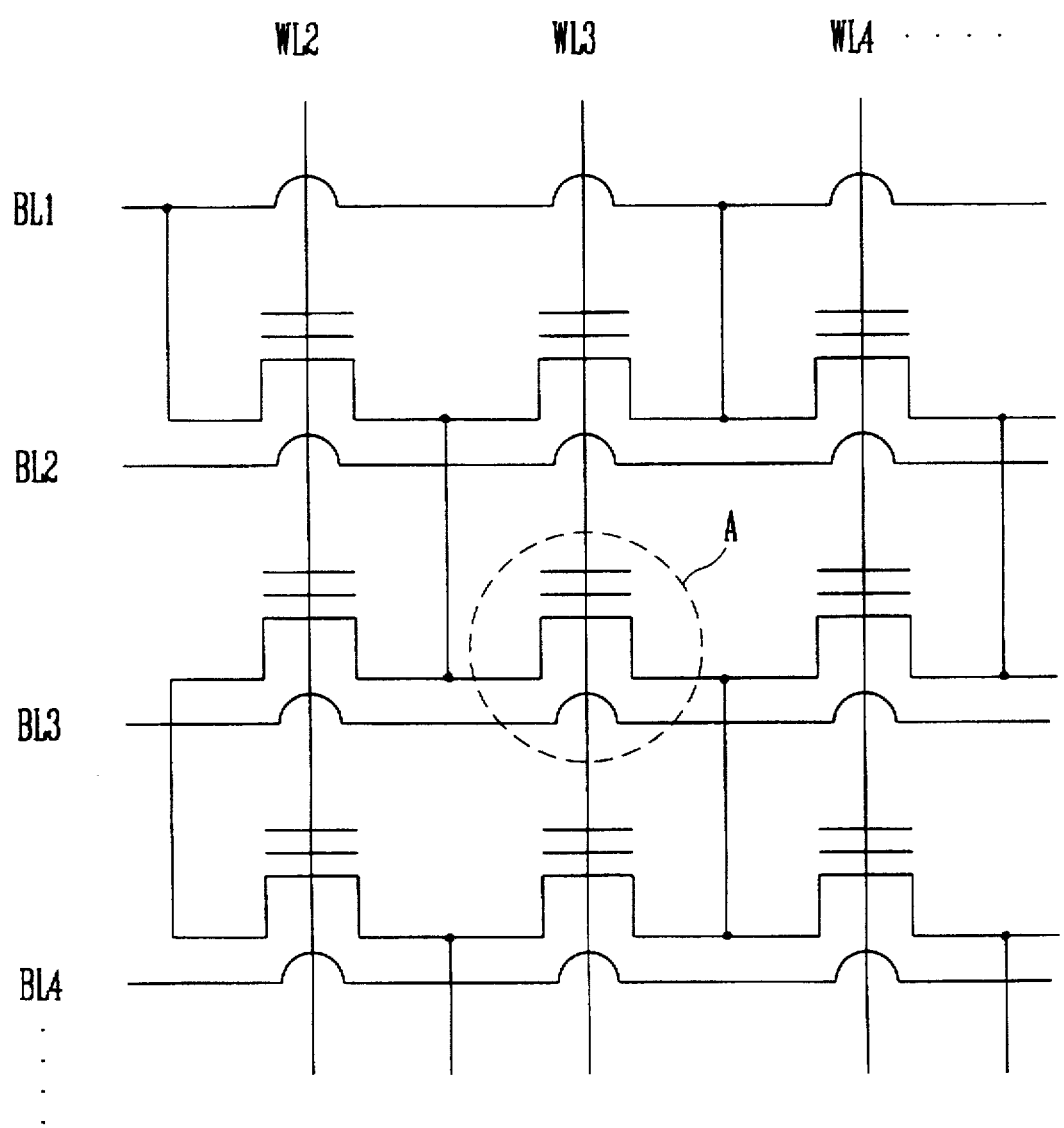
FIG. 4 is a circuit for memory cell array in accordance with the present invention.

Also, memory cell array of the present invention is represented as a circuit shown in FIG. 4. The programming operation, erasing and reading operations of a memory cell shown as the "A" portion in FIG. 4 is as follows.

At first, in programming operation, a voltage of $V_{PG}$ (8 to 20V) is applied to the third word line WL3, and voltage of 0V is applied to the other word lines. A voltage of $V_{PD}$ (3 to 10V) is applied to the third bit line BL3, and voltage of 0V is applied to the first and second bit lines BL1 and BL2. Also, a voltage of $V_{PD}$ is applied to the fourth and fifth bit lines BL4 and BL5. That is, in case that the nth bit line BLn is selected, voltage of 0V is applied to the bit lines from the first to ith (i<n), and a voltage of $V_{DP}$ is applied to the bit lines from the jth (j>n).

In erasing operation, a voltage of $V_{EG}$ is applied to the third word line WL3 and a voltage of $V_{ED}$ (1 to 10V) is applied to the all bit lines.

In reading operation, a voltage of $V_{REF}$ (3 to 6V) is applied to the third word line WL3, and voltage of 0V is applied to the other word lines. A voltage of $V_{READ}$ (0.5 to 2V) is applied to the third bit line BL3, and voltage of 0V is applied to the first and second bit lines BL1 and BL2. Also, a voltage of $V_{PD}$ is applied to the fourth and fifth bit lines BL4 and BL5. That is, in case that the nth bit line BLn is selected, voltage of 0V is applied to the bit lines from the first to ith (i<n), and a voltage of $V_{DP}$ is applied to the bit lines from the jth (j>n).

As mentioned above, four memory cell of the memory cell array according to the present invention hold a source region or a drain region in common so that the occupied area by the contact hole can be decreased. Therefore, such a method as mentioned above can increase an integration density of device, and size of the field oxide layer and floating gate can be increased so that the operation characteristics of device can be enhanced.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. Memory cell array comprising:

a plurality of field oxide layers formed at isolation regions and arranged in the form of a plurality of rows, said each field oxide layer of a row corresponded the space between said field oxide layers of adjacent rows;

a plurality of floating gates formed on a silicon substrate between said field oxide layers of adjacent rows, said each floating gate insulated from said silicon substrate by a tunnel oxide layer;

a plurality of control gates formed on said floating gates which is formed between said field oxide layers and said field oxide layers placed in both sides of said floating gates, said each control gate insulated from said each floating gate by dielectric layer;

a plurality of source regions formed on said silicon substrate surrounded by adjacent four field oxide layers and adjacent four floating gates, said source regions separated from each other by said field oxide layer; and a plurality of drain regions formed on said silicon substrate surrounded by adjacent four field oxide layers and adjacent four floating gates, said drain regions separated from each other by said field oxide layer, whereby said each floating gate is placed between each drain region and each source region so that four memory cells hold said single source region or single drain region in common.

2. The memory cell array as claimed in claim 1, wherein said each field oxide layer is formed in hexagonal shape.

* * * * *